(12) United States Patent
Bhat et al.

(10) Patent No.: US 12,051,576 B2
(45) Date of Patent: *Jul. 30, 2024

(54) MULTICATHODE DEPOSITION SYSTEM AND METHODS

(71) Applicant: Applied Materials, Inc., Santa Clara, CA (US)

(72) Inventors: Sanjay Bhat, Singapore (SG); Vibhu Jindal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 17/110,518

(22) Filed: Dec. 3, 2020

(65) Prior Publication Data

US 2021/0172054 A1 Jun. 10, 2021

Related U.S. Application Data

(60) Provisional application No. 62/944,103, filed on Dec. 5, 2019.

(51) Int. Cl.
| | | |
|---|---|---|
| *H01J 37/34* | (2006.01) | |
| *C23C 14/35* | (2006.01) | |
| *C23C 14/50* | (2006.01) | |
| *C23C 16/458* | (2006.01) | |
| *H01J 37/32* | (2006.01) | |

(52) U.S. Cl.
CPC ........ *H01J 37/3411* (2013.01); *C23C 14/352* (2013.01); *C23C 14/505* (2013.01); *C23C 16/4585* (2013.01); *H01J 37/32642* (2013.01); *H01J 37/32715* (2013.01)

(58) Field of Classification Search
CPC ............ H01J 37/3411; H01J 37/32642; H01J 37/32715; C23C 14/352; C23C 14/505; C23C 14/3407; C23C 14/042; C23C 16/4585; C23C 14/50
See application file for complete search history.

(56) References Cited

U.S. PATENT DOCUMENTS

| | | | |
|---|---|---|---|
| 7,365,351 B2 | 4/2008 | Bowering et al. | |
| 8,911,601 B2 * | 12/2014 | Rasheed | C23C 16/4585 118/728 |
| 11,043,364 B2 * | 6/2021 | Wu | H01J 37/32651 |
| 2006/0137970 A1 | 6/2006 | Ahn | |
| 2007/0080059 A1 | 4/2007 | Takahashi | |

(Continued)

FOREIGN PATENT DOCUMENTS

| | | |
|---|---|---|
| KR | 20120054655 A | 5/2012 |
| KR | 101271560 B1 | 6/2013 |

(Continued)

OTHER PUBLICATIONS

Machine Translation WO 2012002473 A1 (Year: 2012).*

(Continued)

*Primary Examiner* — Michael A Band
(74) *Attorney, Agent, or Firm* — Servilla Whitney LLC (57) ABSTRACT

A physical vapor deposition (PVD) chamber and a method of operation thereof are disclosed. Chambers and methods are described that provide a chamber comprising a deposition ring assembly comprising an inner and outer deposition ring which reduces particle defects.

12 Claims, 6 Drawing Sheets

(56) References Cited

U.S. PATENT DOCUMENTS

| | | | |
|---|---|---|---|
| 2008/0237182 A1 | 10/2008 | Yamawaku et al. | |
| 2009/0283037 A1 | 11/2009 | Hardikar et al. | |
| 2009/0294279 A1 | 12/2009 | Kikuchi et al. | |
| 2014/0262026 A1* | 9/2014 | Forster | B05C 21/005 118/504 |
| 2018/0151337 A1 | 5/2018 | Nguyen et al. | |
| 2018/0350572 A1* | 12/2018 | Wu | H01J 37/3411 |
| 2019/0189499 A1 | 6/2019 | Strassner et al. | |
| 2020/0051797 A1 | 2/2020 | Bhat et al. | |

FOREIGN PATENT DOCUMENTS

| | | | | |
|---|---|---|---|---|
| WO | 2008079722 A2 | 7/2008 | | |
| WO | WO-2012002473 A1 * | 1/2012 | ......... | C23C 14/3464 |
| WO | WO-2012033198 A1 * | 3/2012 | ......... | C23C 14/3464 |

OTHER PUBLICATIONS

"Taper" definition. Oxford Languages, from Google Search of "taper definition".*

PCT International Search Report and Written Opinion in PCT/US2019/045917 dated Nov. 18, 2019, 12 pages.

PCT International Search Report and Written Opinion in PCT/US2020/063235 dated Mar. 11, 2021, 10 pages.

* cited by examiner

MULTICATHODE DEPOSITION SYSTEM AND METHODS

CROSS-REFERENCE TO RELATED APPLICATIONS

The present disclosure claims priority to U.S. provisional application Ser. No. 62/944,103, filed on Dec. 5, 2019, the entire content of which is incorporated herein by reference.

TECHNICAL FIELD

The present disclosure relates generally to substrate processing systems, and more specifically, to deposition systems with multiple cathode assemblies (multi-cathodes) having one or more features to reduce particles and control temperature during processing.

BACKGROUND

Physical vapor deposition (PVD) is used for the deposition of metals and related materials in the fabrication of semiconductor integrated circuits. Use of PVD has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively affect the properties of the final product.

During the manufacture of mask blanks, the EUV mask blank reticle is transported inside a processing chamber such as a PVD processing chamber. The EUV mask blank reticle is placed on top of a carrier base, which is placed on a rotatable pedestal of the PVD processing chamber. Because of stresses placed on the carrier base during manufacturing and cleaning of the carrier base, it is difficult to obtain flatness of less than 0.01 inches across the bottom surface of the carrier base. As will be described further below, the PVD processing chamber includes a deposition ring which bridges a gap between a cover ring and the rotatable pedestal to prevent deposition material from entering therebetween, which causes generation of particles. When the carrier base is placed on the rotatable pedestal, the outer edge of the carrier base overlaps the deposition ring. There is a gap of less than 0.01 inches between the bottom surface of the carrier base and the top surface of the deposition ring. Any deviation in flatness of the carrier base will lead to friction between the adjacent parts. Friction not only causes generation of particles, but the friction also creates vibrations. The vibrations can cause the reticle from its position on the carrier.

While advancements in PVD chamber design have been made, there remains a need to reduce defect sources such as particles in PVD processing chambers.

SUMMARY

A first embodiment pertains to physical vapor deposition (PVD) chamber comprising a plurality of cathode assemblies; a rotatable pedestal configured to support a substrate, the pedestal comprising an edge; an inner deposition ring adjacent to the edge of the pedestal; and an outer deposition ring adjacent to the inner deposition ring.

According to a second embodiment, a physical vapor deposition (PVD) chamber comprises a plurality of cathode assemblies; a rotatable pedestal configured to support a substrate, the pedestal comprising an edge; an inner deposition ring adjacent to the edge of the pedestal; an outer deposition ring adjacent to the inner deposition ring; and a motor coupled to a shaft to rotate the rotatable pedestal in a range of 10-20 revolutions per minute (RPM), a rotational acceleration in a range of 0.10-15 RPM/second and a deceleration in a range of 0.10-0.15 RPM/second.

According to a third embodiment, a method of depositing a material layer comprises placing a substrate in a PVD chamber comprising a plurality of cathode assemblies; a rotatable pedestal configured to support a substrate, the pedestal comprising an edge; an inner deposition ring adjacent to the edge of the edge of the pedestal; an outer deposition ring adjacent to the inner deposition ring; and depositing a material layer on the substrate.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

Embodiments of the disclosure pertain to a magnet design for a deposition system, for example a physical vapor deposition ("PVD") chamber comprising at least one cathode assembly, and in particular embodiments, a PVD chamber comprising multiple cathode assemblies (referred to herein as a "multi-cathode chamber").

Figure 1:
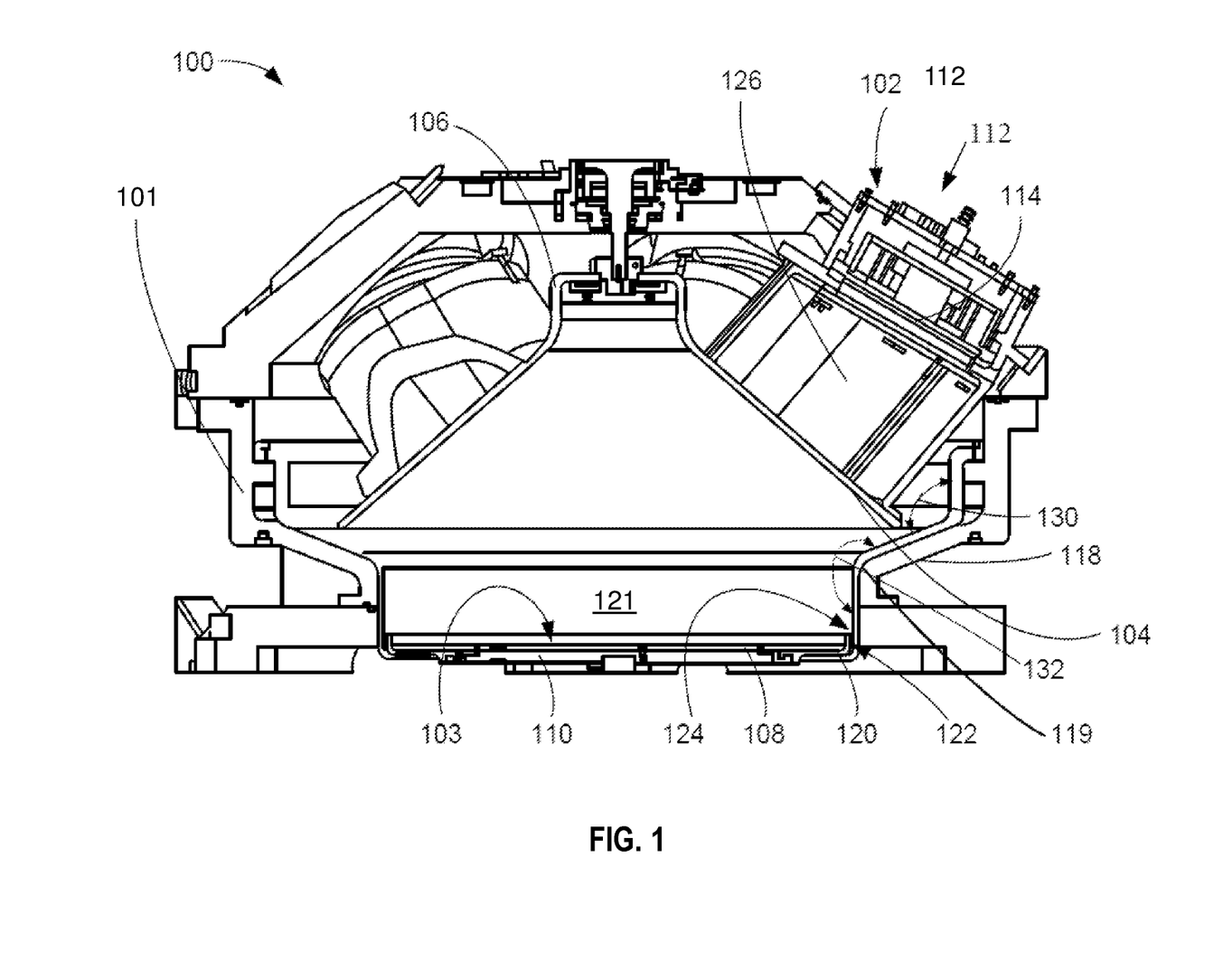
FIG. 1 is a side view of a PVD deposition chamber.

FIG. 1 shows a side view of deposition system in the form of a PVD chamber 100. The deposition system in the form of a PVD chamber is shown as a multi-cathode PVD chamber 100 including a plurality of cathode assemblies 102. The multi-cathode PVD chamber 100 is shown as including a multi-target PVD source configured to manufacture an MRAM (magnetoresistive random access memory) or a multi-target PVD source configured to manufacture an extreme ultraviolet (EUV) mask blank.

The multi-cathode PVD chamber comprises a chamber body 101, comprising an adapter (not shown) configured to hold a plurality of cathode assemblies 102 in place in a spaced apart relationship. The multi-cathode PVD chamber 100 in some embodiments includes a plurality of cathode assemblies 102 for PVD and sputtering. Each of the cathode assemblies 102 is connected to a power supply 112 including direct current (DC) or radio frequency (RF).

The cross-sectional view depicts an example of a PVD chamber 100 including the chamber body 101 defining an inner volume 121, where a substrate or carrier is processed.

The cathode assemblies 102 in the embodiment shown in FIG. 1 are used for sputtering different materials as a material layer 103. The cathode assemblies 102 are exposed through shield holes 104 of an upper shield 106, which is disposed over the substrate or carrier 108 on a rotatable pedestal 110. There may generally be only one carrier 108 over or on the rotatable pedestal 110.

The substrate or carrier 108 is shown as a structure having a semiconductor material used for fabrication of integrated circuits. For example, the substrate or carrier 108 comprises a semiconductor structure including a wafer. Alternatively, the substrate or carrier 108 in some embodiments is another material, such as an ultra low expansion glass substrate used to form an EUV mask blank. The substrate or carrier 108 can be any suitable shape such as round, square, rectangular or any other polygonal shape.

The upper shield 106 is formed with the shield holes 104 so that the cathode assemblies 102 in some embodiments are used to deposit the material layers 103 through the shield holes 104. A power supply 112 is applied to the cathode assemblies 102. The power supply 112 in some embodiments includes a direct current (DC) or radio frequency (RF) power supply.

The upper shield 106 is configured to expose one of the cathode assemblies 102 at a time and protect other cathode assemblies 102 from cross-contamination. The cross-contamination is a physical movement or transfer of a deposition material from one of the cathode assemblies 102 to another of the cathode assemblies 102. The cathode assemblies 102 are positioned over targets 114. A design of a chamber in some embodiments is compact. The targets 114 in some embodiments are any suitable size. For example, each of the targets 114 in some embodiments has a diameter in a range of from about 4 inches to about 20 inches, or from about 4 inches to about 15 inches, or from about 4 inches to about 10 inches, or from about 4 inches to about 8 inches or from about 4 inches to about 6 inches.

In FIG. 1, the substrate or carrier 108 is shown as being on the rotatable pedestal 110, which in some embodiments move vertically up and down. Before the substrate or carrier 108 moves out of the chamber, the substrate or carrier 108 in some embodiments moves below a lower shield 118. A telescopic cover ring 120 abuts the lower shield 118. Then, the rotatable pedestal 110 in some embodiments move down, and then the carrier 108 is raised with a robotic arm before the carrier 108 moves out of the chamber.

When the material layers 103 are sputtered, the materials sputtered from the targets 114 in some embodiments are retained inside and not outside of the lower shield 118. In this prior art embodiment, telescopic cover ring 120 includes a raised ring portion 122 that curves up and has a predefined thickness. The telescopic cover ring 120 in some embodiments are includes a predefined gap 124 and a predefined length with respect to the lower shield 118. Thus, the materials that form material layers 103 will not be below the rotatable pedestal 110 thereby eliminating contaminants from spreading to the substrate or carrier 108.

FIG. 1 depicts individual shrouds 126. The shrouds 126 in some embodiments are designed such that a majority of the materials from the targets 114 that does not deposit on the carrier 108 is contained in the shrouds 126, hence making it easy to reclaim and conserve the materials. This also enables one of the shrouds 126 for each of the targets 114 to be optimized for that target to enable better adhesion and reduced defects.

The shrouds 126 in some embodiments are designed to minimize cross-talk or cross-target contamination between the cathode assemblies 102 and to maximize the materials captured for each of the cathode assemblies 102. Therefore, the materials from each of the cathode assemblies 102 would just be individually captured by one of the shrouds 126 over which the cathode assemblies 102 are positioned. The captured materials may not be deposited on the substrate or carrier 108. For example, a first cathode assembly and a second cathode assembly in some embodiments apply alternating layers of different materials in the formation of an extreme ultraviolet mask blank, for example, alternating layers of silicon deposited from a first target and cathode assembly 102 and a molybdenum from a second target and cathode assembly 102.

The substrate or carrier 108 in some embodiments are coated with uniform material layer 103 deposited on a surface of the substrate or carrier 108 using the deposition materials including a metal from the targets 114 over the shrouds 126. Then, the shrouds 126 are taken through a recovery process. The recovery process not only cleans the shrouds 126 but also recovers a residual amount of the deposition materials remained on or in the shrouds 126. For example, there may be molybdenum on one of the shrouds 126 and then silicon on another of the shrouds 126. Since molybdenum is more expensive than silicon, the shrouds 126 with molybdenum are sent out for the recovery process.

As shown in FIG. 1, the lower shield 118 is provided with a first bend resulting from small angle 130 and a second bend resulting from large angle 132, which results in a knee 119 in the lower shield 118. This knee 119 provides an area in which particles can accumulate during deposition, and is thus a possible source for processing defects.

Figure 2:
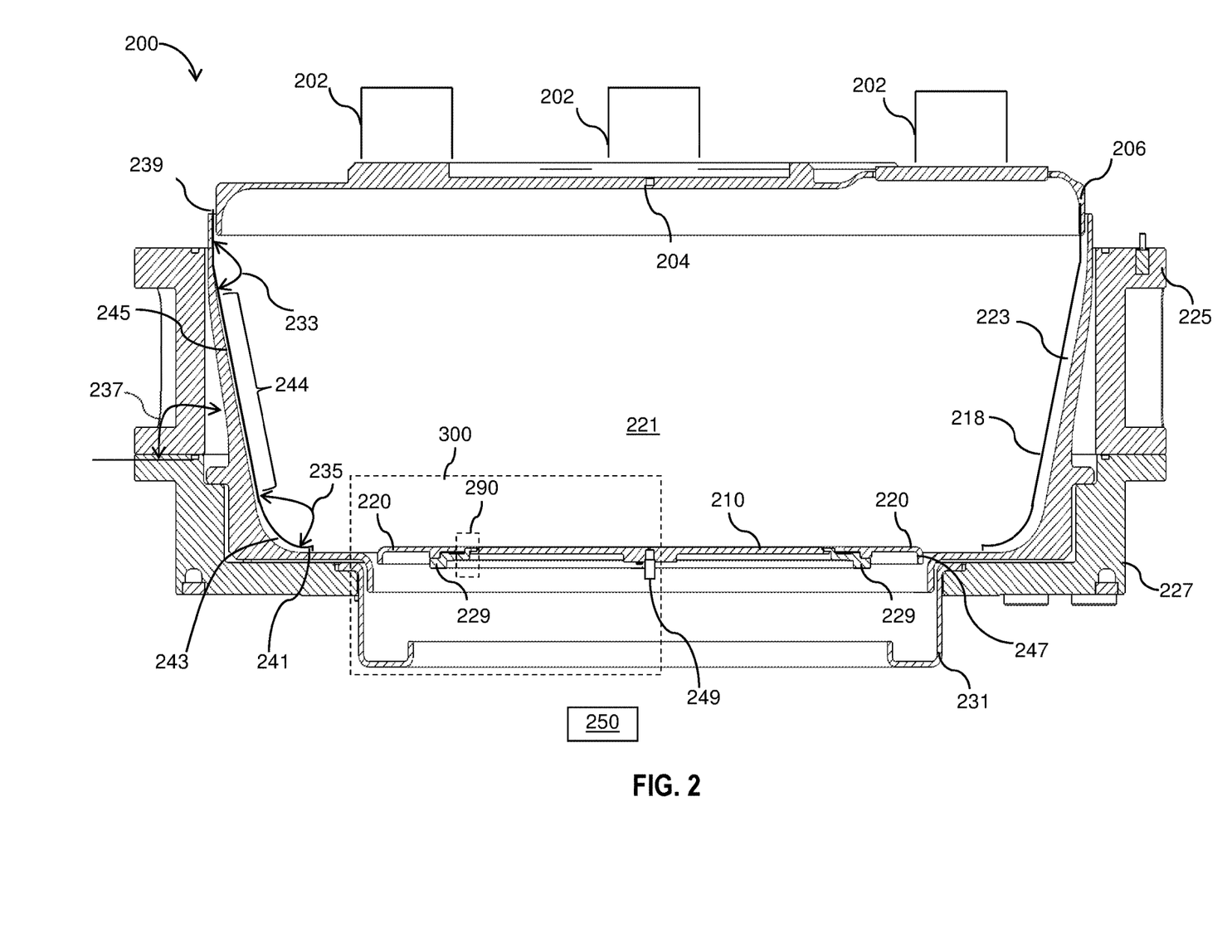
FIG. 2 is a side view of a PVD deposition chamber according to one or more embodiments.

FIG. 2 depicts a PVD chamber 200 in accordance with a first embodiment of the disclosure. PVD chamber 200 includes a plurality of cathode assemblies 202. An upper shield 206 is provided below the plurality of cathode assemblies 202, the upper shield 206 having one or more shield holes 204 to expose the cathode assembly to the interior space 221 of the chamber (only one shield hole 204 depicted in FIG. 2 for clarity). A lower shield 218 is provided below and adjacent upper shield 206.

A modular chamber body is disclosed in FIG. 2, in which an intermediate chamber body 225 is located above and adjacent a lower chamber body 227. The intermediate chamber body 225 is secured to the lower chamber body 227 to form the modular chamber body, which surrounds lower shield 218. A lower shield liner 223 maintains the same general contour as lower shield 218, lower shield liner 223 being disposed between intermediate chamber body 225 and lower chamber body 227 (i.e., the modular chamber body) and the lower shield 218 to also surround lower shield 218. A top adapter 273 is disposed above intermediate chamber body 225 to surround upper shield 206.

PVD chamber 200 is also provided with a rotatable pedestal 210 similar to rotatable pedestal 110 in FIG. 1. A person of ordinary skill will readily appreciate that other components of a PVD chamber, such as those referenced above in FIG. 1 but omitted in FIG. 2 for the sake of clarity, are provided in PVD chamber 200 according to one or more embodiments.

In PVD chamber 200, cover ring 220 is provided with a peripheral lip defining sidewalls 247 that face away from the upper shield 206, whereas cover ring 120 in FIG. 1 is provided with a raised ring portion 122 and thus has upward facing sidewalls (i.e., sidewalls that face toward upper shield 106). Furthermore, PVD chamber 200 is provided with a bottom liner 231 and a deposition ring 229, as shown in FIG. 2. The deposition ring 229 bridges the gap between the cover ring 220 and rotatable pedestal 210 to prevent deposition material from entering therebetween.

Lower shield 218 is provided with an upper end 239 in contact with the upper shield 206, and a lower end 241 opposite the upper end 239. Lower shield wall 243 of lower shield 218 extends from upper end 239 to lower end 241, and has a height H, as shown in FIG. 2. Lower shield wall 243 includes a lower shield wall inner surface 245 that has a straight region 244 that does not have any bends or curves, which minimizes collection of particles. Thus, the lower shield wall inner surface 245 has a contour that is substantially straight to minimize accumulation of particles on the shield. This straight region 244 extends in the embodiment shown from upper end 239 as shown in FIG. 2. This straight region 244 of the lower shield wall inner surface 245 is, in certain embodiments, free of bends having an angle in a range of from about 0.1 degrees and about 120 degrees and in a range of from about 210 degrees and about 360 degrees. For example, in some embodiments, angle 233 is in the range of from about 150 degrees to about 175 degrees, such as in a range of from between about 160 degrees and about 170 degrees.

For purposes of illustration, and not limitation, the lower shield wall inner surface 245 according to one or more embodiments has transition that provides an angle 235 that is in the range of from about 91 degrees to about 120 degrees, such as in a range of from about 100 degrees to about 110 degrees. Angle 237, which is formed by a reference line parallel to the plane or surface of a mask blank, and the outer surface of lower shield liner 223, is in the range of from about 89 degrees to about 65 degrees, such as in the range of from about 85 degrees to about 73 degrees. While other dimensions could be provided to yield angles 233, 235, and 237 outside of these exemplary ranges, there are no bends or sharp curves in the straight region 244 of the lower shield wall inner surface 245 to form a knee, such as knee 119 in FIG. 1. The design according to one or more embodiments that is free of bends or sharp curves in the straight regions avoids collection of particles, thereby minimizing a defect source in the manufacture of articles in the chamber.

Figure 3:
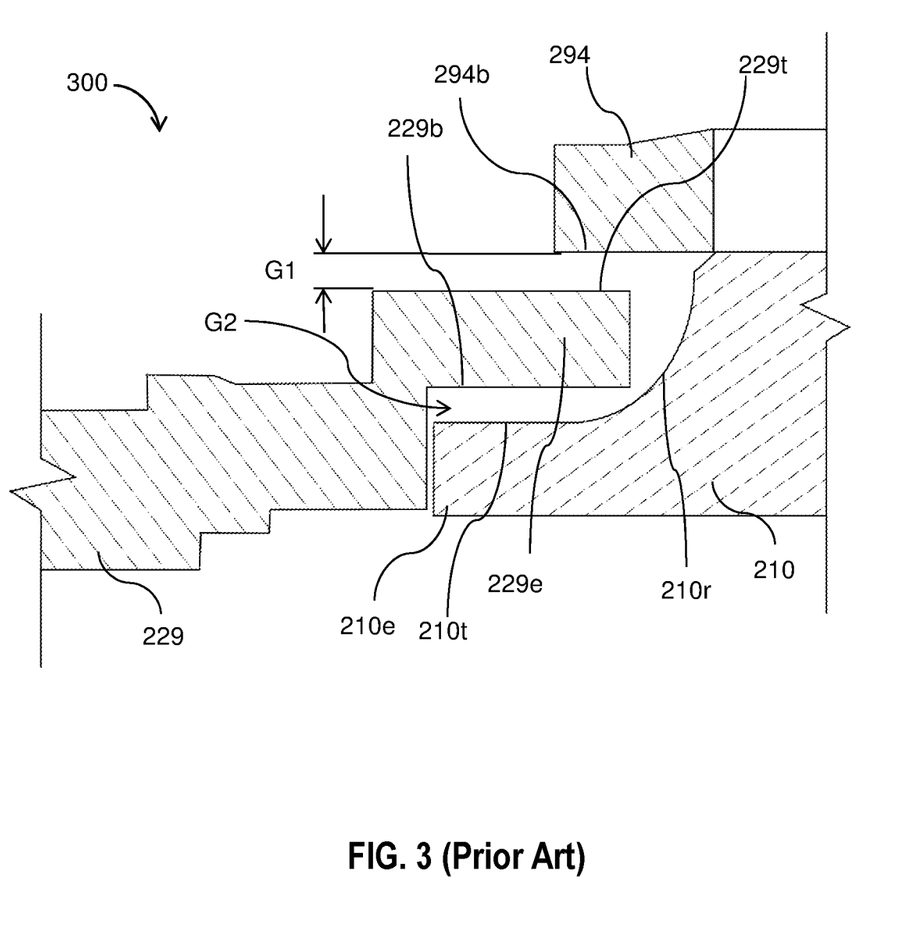
FIG. 3 is an enlarged side view of a portion of the PVD chamber depicted in FIG. 2 showing a prior art deposition ring.
Figure 4:
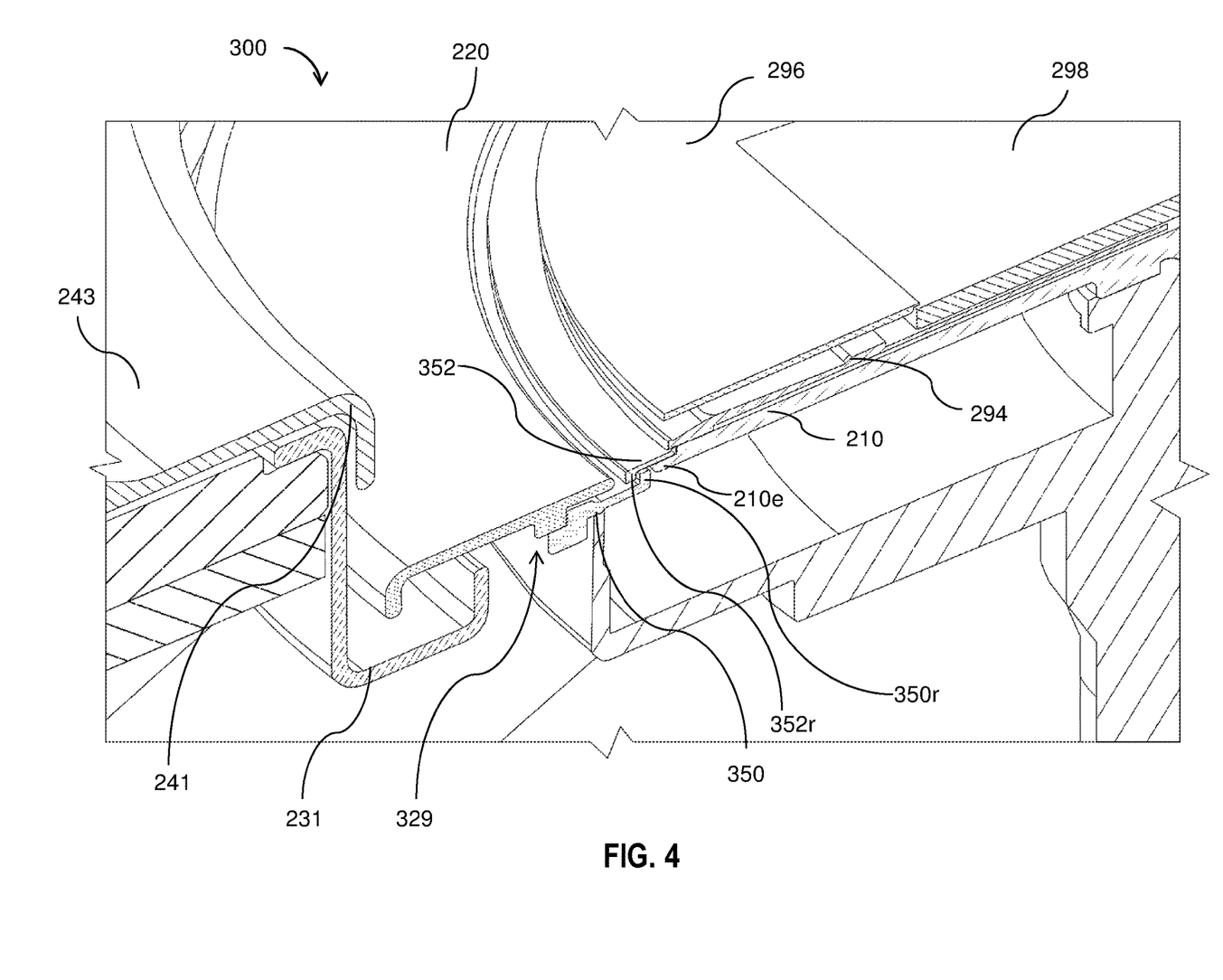
FIG. 4 is an enlarged isometric view of a portion of the PVD chamber shown in FIG. 2 showing a deposition ring assembly according to an embodiment of the disclosure.
Figure 5:
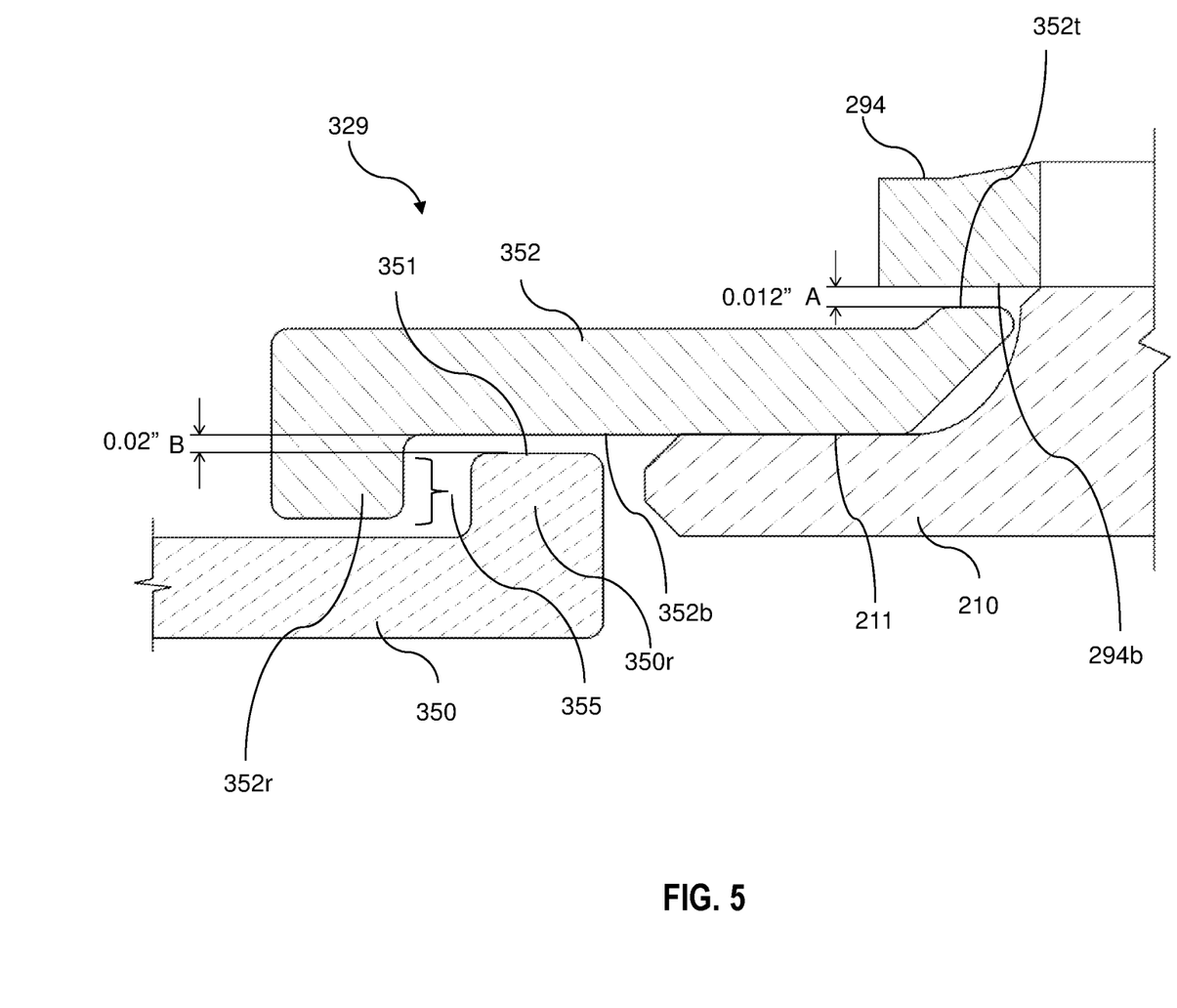
FIG. 5 is an enlarged side view showing a deposition ring assembly according to one or more embodiments of the disclosure.

Referring now to FIG. 3, an enlarged view of the area 290 indicated by the dashed line box in FIG. 2 is shown. As shown in FIG. 3, a carrier base 294 is disposed on the rotatable pedestal 210 (which is not shown in FIG. 2). The rotatable pedestal 210 includes a tapered edge region 210e, which has a thickness that is less than a central region of the rotatable pedestal 210. The thickness of the rotatable pedestal tapers at a tapered edge region 210e, which tapers from the thicker portion of the rotatable pedestal 210 to the tapered edge region 210e along a concave tapered section 210r. The deposition ring 229 includes an edge portion 229e which substantially overlaps with the edge region 210e of the rotatable pedestal 210, and the cover ring edge region 220e overlaps with the deposition ring edge portion 229e. As mentioned above, there can be a gap G1 as small as 0.01" (0.254 mm) between a bottom surface 220b of the cover ring and a top surface 229t of the deposition ring 229. Likewise, there can be a gap G2 as small as 0.01" (0.254 mm) between a bottom surface 229b of the deposition ring 229 and a top surface 210t of the rotatable pedestal 210. The rotatable pedestal 210 coupled with rotation of the deposition ring can cause friction between the two rotating parts, which has a tendency to generate particles in the deposition chamber FIG. 4 shows an enlarged cross-sectional portion of the area 300 of a deposition chamber 200 of the type shown in FIG. 2 with a modified deposition ring and pedestal according to one or more embodiments of the disclosure. FIG. 5 shows an enlarged view of the deposition ring assembly shown in FIG. 4. In FIGS. 4 and 5, a carrier base 294 is shown as supported on the rotatable pedestal 210. In FIG. 4, an extreme ultraviolet mask blank reticle 298 is shown supported on the carrier base 294, and a top shield 296 is supported on the carrier base 294 and surrounding the extreme ultraviolet mask blank reticle 298.

According to one or more embodiments of the disclosure, the components of the deposition chamber correspond to the description of FIG. 2, except for the differences noted with respect to FIG. 4 and FIG. 5. The deposition ring 229 shown in FIG. 3 comprises a unitary ring which rotates and create a friction with the rotatable pedestal 210. In embodiments described herein and shown in FIG. 4 and FIG. 5, the deposition ring 229 shown in FIG. 3 is replaced with a deposition ring assembly 329. The deposition ring assembly 329 comprises an outer deposition ring 350 and an inner deposition ring 352. Thus, the deposition ring assembly 329 comprises two distinct segments, which eliminate friction between the rotatable pedestal 210 and the rotating deposition ring 229 shown in FIG. 3.

According to one or more embodiments, during operation of the PVD chamber 200, such as during a physical vapor deposition process, there is relative rotational motion between the inner deposition ring 352 and the outer deposition ring 350. However, there is no relative rotational motion between the inner deposition ring 352 and the adjacent rotatable pedestal 210. Instead, the rotatable pedestal 210 and the adjacent inner deposition ring 352 both rotate, and the outer deposition ring 350 remain stationary or fixed in position during a physical vapor deposition process. In the prior art design shown in FIG. 3, there is relative rotational motion between deposition ring 229, which is fixed or static, and the rotatable pedestal 210 during operation of a PVD chamber such as during a physical vapor deposition process.

Referring again to FIG. 4, a carrier base 294, which is configured to support an extreme ultraviolet mask blank reticle 298 is placed on top of the rotatable pedestal 210. In the embodiment shown a top shield cover 296 is placed on top of the carrier base 294 and surrounds the extreme ultraviolet mask blank reticle 298. FIG. 4 also shows the lower shield wall 243 shown in FIG. 2 overlapping with the bottom liner 231. The top cover 220 is shown as overlapping with the bottom liner 231 and engaged with the outer deposition ring 350.

FIG. 5 shows additional details of the split or bifurcated deposition ring assembly 329. The inner deposition ring has a bottom surface 352*b* which engages and is in contact with a top surface 211 of the rotatable pedestal 210. The inner deposition ring 352 comprises a protruding rim 352*r* extending downwardly from the inner deposition ring 352. The outer deposition ring 350 comprises a protruding rim 350*r* extending upwardly from the outer deposition ring 350. As shown in FIG. 5, the outer deposition ring protruding rim 350*r* and the inner deposition ring protruding rim 352*r* overlap for a distance 355.

As shown in FIG. 5, the carrier base 294 rests upon the rotatable pedestal 210 and there is a gap defining a distance A between a bottom surface 294*b* of the carrier base 294 and a top surface 352*t* of the inner deposition ring 352. In one or more embodiments, the distance "A" defining the gap between the bottom surface 294*b* of the carrier base 294 and the top surface 352*t* of the inner deposition ring 352 is 0.010 inches (0.254 mm) or greater, for example 0.012 inches (0.305 mm). Even if the carrier base is not manufactured with precise flatness, the gap reduces or eliminates the possibility of friction between the carrier base 294 and the inner deposition ring 352 when the rotatable pedestal 210 and inner deposition ring 352 are rotating during PVD deposition process. In some embodiments, there is a gap defining a distance "B" between the bottom surface 352*b* of the inner deposition ring and the top surface 351 of the outer deposition ring 350. In one or more embodiments, the distance "B" defining the gap between the bottom surface 352*b* of the inner deposition ring and the top surface 351 of the outer deposition ring 350 is 0.020 inches (0.508 mm).

Figure 6A:
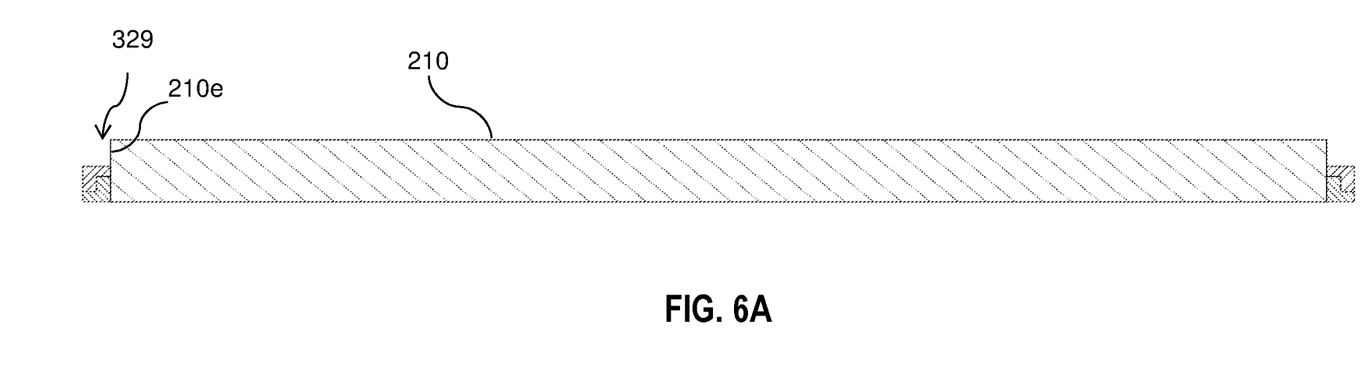
FIG. 6A is side view a deposition ring assembly and a rotatable pedestal according to an embodiment of the disclosure.
Figure 6B:
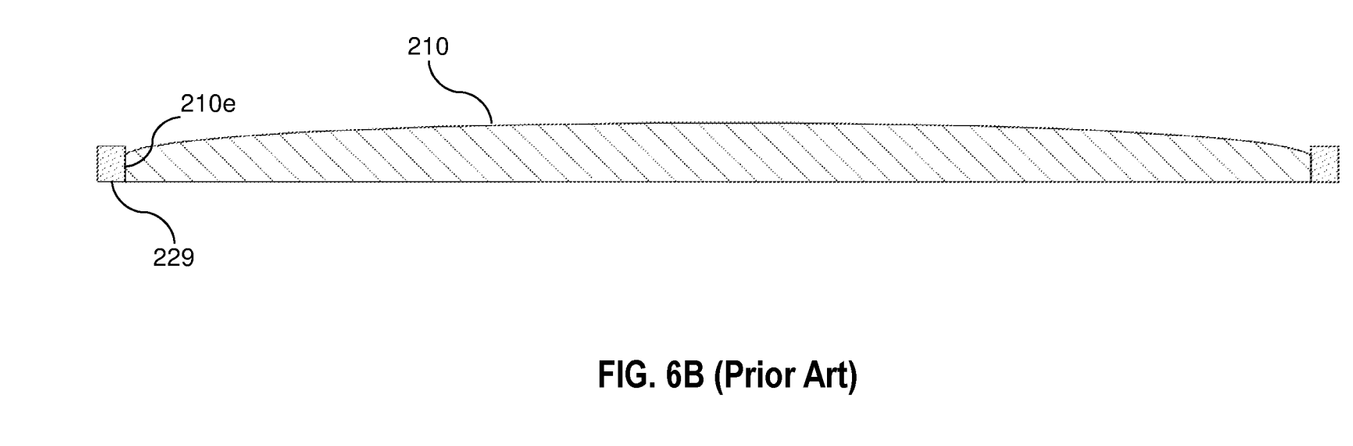
FIG. 6B is a side view of a prior art deposition ring and a rotatable pedestal.

Experiments were conducted using a rotating aluminum rotatable pedestal surrounded by a stationary deposition ring of the type shown in FIG. 3 and made from a ceramic material. Even normal rotation of a carrier base and reticle in a PVD chamber caused large number of scratches on the backside of a wafer placed on the pedestal, which resulted in defects on the front side of the wafer. The large number of defects seen on the wafer were predominantly due to curvature of the aluminum rotatable pedestal. As shown in FIG. 6B, the edge 210*e* of the rotatable pedestal 201 has a thickness that is less than the thickness of the deposition ring 229. This design causes the wafer to contact the deposition ring 229 while the rotatable pedestal 210 is rotating during operation of the PVD chamber, which caused the wafer to slip on the rotatable pedestal 210 during rotation and caused concentric scratches on the backside of the wafer.

According to an embodiment of the disclosure, replacing the malleable metallic rotatable pedestal 210 and the deposition ring 229 with a flat, non-concave ceramic rotatable pedestal 210 and the deposition ring assembly 329 shown in FIG. 5 helped mitigate the issues with the rotatable pedestal shown in FIG. 6B. The thickness of the deposition ring assembly at the edge of the rotatable pedestal 210 was less than the edge of the rotatable pedestal 210.

It was determined that reducing the rotational acceleration of the rotatable pedestal reduced particle defects on EUV mask blanks processed in the PVD chamber. Hence by simply reducing the rotational acceleration/deceleration of the rotatable pedestal, particle defects were reduced. In one or more embodiments rotating the rotatable pedestal in a range of 10-20 revolutions per minute (RPM), a rotational acceleration in a range of 0.10-15 RPM/second and a deceleration in a range of 0.10-0.15 RPM/second reduced particle defects. One or more embodiments comprise a PVD chamber as shown with respect to FIGS. 2, 4, and 5 including a motor 250 coupled to a shaft 249 to rotate the rotatable pedestal 210 in a range of 10-20 revolutions per minute (RPM), a rotational acceleration in a range of 0.10-15 RPM/second and a deceleration in a range of 0.10-0.15 RPM/second.

The PVD chambers 200 described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer in some embodiments are formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layer of, for example, molybdenum and silicon are formed by physical vapor deposition, for example, in a multi-cathode source chamber.

The PVD chambers 200 described herein are utilized to form the multilayer stack, as well as capping layers and absorber layers. For example, the physical vapor deposition systems in some embodiments form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds in some embodiments include oxides, dioxides, atomic mixtures having oxygen atoms, or a combination thereof.

Thus, in a specific embodiment, a method is provided in which any of the chambers 200 described herein are utilized to perform a method comprising placing a substrate in the PVD chamber comprising a plurality of cathode assemblies and a deposition ring assembly comprising an outer deposition ring and an inner deposition ring.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A physical vapor deposition (PVD) chamber comprising:
   a plurality of cathode assemblies;
   a rotatable pedestal configured to support a substrate, the rotatable pedestal comprising a tapered edge having a top surface;
   an inner deposition ring adjacent to the tapered edge of the rotatable pedestal, the inner deposition ring having a bottom surface which engages and is in contact with the top surface of the tapered edge of the rotatable pedestal so that the inner deposition ring rotates with the rotatable pedestal during a physical vapor deposition process which deposits a material layer on the substrate, a top surface defining a gap between a bottom surface of the substrate when the substrate is placed upon the rotatable pedestal, and a protruding rim extending downwardly;
   an outer deposition ring adjacent to the inner deposition ring and having a top surface defined by a protruding rim extending upwardly from the outer deposition ring overlapping with the protruding rim extending downwardly from the inner deposition ring and there is a gap between the top surface of the outer deposition ring and the inner deposition ring, and the inner deposition ring is configured to rotate with the rotatable pedestal during the physical vapor deposition process, and the outer deposition ring is configured to be stationary and not rotate during the physical vapor deposition process; and
   a cover ring engaged with and overlapping a portion of the outer deposition ring and overlapping with a bottom liner, and the bottom liner overlapping with a lower shield at a lower end of the lower shield; and
   a motor coupled to a shaft.

2. The PVD chamber of claim 1, the cover ring further comprising a peripheral lip defining a sidewall facing downwardly.

3. The PVD chamber of claim 1, wherein the rotatable pedestal comprises a ceramic material.

4. The PVD chamber of claim 3, wherein the rotatable pedestal is flat and non-concave.

5. The PVD chamber of claim 1, wherein the gap between the top surface of the inner deposition ring and a bottom surface of a carrier base is greater than 0.254 mm.

6. A method of depositing a material layer comprising:
   placing the substrate in the PVD chamber of claim 1;
   depositing the material layer on the substrate; and
   rotating the rotatable pedestal and reducing a rotational acceleration and a rotational deceleration so that the rotational deceleration is in a range of 0.10-0.15 RPM/second.

7. The method of claim 6, wherein the substrate comprises an EUV mask blank reticle, and the method further comprises placing the EUV mask blank reticle on a carrier base and placing the carrier base on the rotatable pedestal.

8. The method of claim 7, further comprising rotating the inner deposition ring with the rotatable pedestal and maintaining the outer deposition ring as stationary.

9. The PVD chamber of claim 1, wherein the motor is configured to rotate the rotatable pedestal in a range of from 10-20 revolutions per minute (RPM).

10. The method of claim 6, wherein the motor is configured to rotate the rotatable pedestal in a range of from 10-20 revolutions per minute.

11. The PVD chamber of claim 9, wherein the motor is configured to rotate the rotatable pedestal at a rotational deceleration in a range of 0.10-0.15 RPM/second.

12. The PVD chamber of claim 5, wherein there is a gap between the bottom surface of the inner deposition ring and the top surface of the outer deposition ring, the gap being 0.508 mm.

* * * * *